United States Patent
Ding et al.

(10) Patent No.: US 12,256,522 B2
(45) Date of Patent: Mar. 18, 2025

(54) HEAT DISSIPATION DEVICE AND ELECTRONIC EQUIPMENT

(71) Applicant: Lenovo (Beijing) Limited, Beijing (CN)

(72) Inventors: Xintong Ding, Beijing (CN); Puyu Yao, Beijing (CN); Ting Tian, Beijing (CN)

(73) Assignee: LENOVO (BEIJING) LIMITED, Beijing (CN)

( * ) Notice: Subject to any disclaimer, the term of this patent is extended or adjusted under 35 U.S.C. 154(b) by 215 days.

(21) Appl. No.: 17/941,715

(22) Filed: Sep. 9, 2022

(65) Prior Publication Data

US 2023/0209778 A1 Jun. 29, 2023

(30) Foreign Application Priority Data

Dec. 29, 2021 (CN) .......................... 202111640733.8

(51) Int. Cl.
 *H05K 7/20* (2006.01)
 *H01L 23/367* (2006.01)

(52) U.S. Cl.
 CPC ......... *H05K 7/2039* (2013.01); *H01L 23/367* (2013.01); *H05K 7/20218* (2013.01)

(58) Field of Classification Search
 CPC .. F28D 15/0241; F28D 15/04; F28D 15/0266; F28D 15/0275; F28D 15/046; F28D 15/0233; H01L 23/3672; H01L 23/427; H01L 23/367; H05K 7/20336; H05K 7/2039; H05K 1/0203; H05K 7/20309; H05K 7/2099
 See application file for complete search history.

(56) References Cited

U.S. PATENT DOCUMENTS

| | | | |
|---|---|---|---|
| 10,088,879 B2 * | 10/2018 | Jin | G06F 1/203 |
| 10,184,729 B2 * | 1/2019 | Inagaki | F28D 15/0241 |
| 10,595,439 B2 * | 3/2020 | Shia | H01L 23/427 |
| 2006/0086482 A1 | 4/2006 | Thayer et al. | |
| 2007/0107877 A1 * | 5/2007 | Hou | F28D 15/025 165/104.26 |
| 2007/0272399 A1 * | 11/2007 | Nitta | F28D 15/046 165/185 |
| 2008/0105405 A1 * | 5/2008 | Hsu | F28D 15/046 165/104.26 |
| 2011/0220328 A1 * | 9/2011 | Huang | F28D 15/046 29/890.032 |

(Continued)

FOREIGN PATENT DOCUMENTS

| | | |
|---|---|---|
| CA | 2961277 A1 | 12/2015 |
| CN | 204373481 U | 6/2015 |

(Continued)

*Primary Examiner* — Adam B Dravininkas
(74) *Attorney, Agent, or Firm* — ANOVA LAW GROUP, PLLC

(57) ABSTRACT

A heat dissipation device includes: a rigid tube, including a first cavity; a first capillary structure, at least a portion of the first capillary structure being positioned within the first cavity; a flexible tube, including a second cavity, the flexible tube being more flexible than the rigid tube; and a second capillary structure, at least a portion of the second capillary structure being positioned within the second cavity, wherein the heat dissipation device is deformable via the flexible tube.

20 Claims, 5 Drawing Sheets

(56) References Cited

U.S. PATENT DOCUMENTS

2018/0031329 A1 2/2018 Wang et al.
2018/0238632 A1 8/2018 Jia et al.
2020/0248970 A1 8/2020 Chen

FOREIGN PATENT DOCUMENTS

CN 106871677 A 6/2017
CN 113710050 A 11/2021

* cited by examiner

HEAT DISSIPATION DEVICE AND ELECTRONIC EQUIPMENT

RELATED APPLICATION(S)

This application claims priority to Chinese Patent Application No. 202111640733.8 filed with the National Intellectual Property Administration, PRC on Dec. 29, 2021, which is incorporated herein by reference in entirety.

FIELD OF THE TECHNOLOGY

The present disclosure relates to a heat dissipation device and an electronic equipment.

BACKGROUND

The heat dissipation device is a device that people often use; however, certain existing heat dissipation devices are met with limited use due to singular shape and poor adaptability.

SUMMARY

In one aspect, the present disclosure provides a heat dissipation device. The heat dissipation device includes: a rigid tube, including a first cavity; a first capillary structure, at least a portion of the first capillary structure being positioned within the first cavity; a flexible tube, including a second cavity, the flexible tube being more flexible than the rigid tube; and a second capillary structure, at least a portion of the second capillary structure being positioned within the second cavity, wherein the heat dissipation device is deformable via the flexible tube.

In certain embodiment(s), the first capillary structure includes a metal.

In certain embodiment(s), the heat dissipation device further includes a support ring, at least a portion of the support ring being positioned within the second cavity.

In certain embodiment(s), at least a second portion of the second capillary structure is positioned within a cavity of the support ring.

In certain embodiment(s), the support ring contacts the rigid tube.

In certain embodiment(s), a gap is present between the support ring and the rigid tube, and a second portion of the second capillary structure is positioned within the gap.

In certain embodiment(s), the support ring is a first support ring, and the heat dissipation device further includes: a second support ring, positioned in the second cavity and being spaced apart from the first support ring.

In certain embodiment(s), the second capillary structure includes a pipe-shaped part, the pipe-shaped part being curved or spiral.

In certain embodiment(s), the rigid tube is a first rigid tube, and the heat dissipation device further includes: a second rigid tube, the first and the second rigid tubes respectively connected to two ends of the flexible tube, a positional relationship between the first and the second rigid tubes is changeable via the flexible tube, wherein the flexible tube is deformable.

In certain embodiment(s), a cross-section of the heat dissipation device includes, in this order, a first portion of the flexible tube, a first portion of the second capillary structure, a second portion of the second capillary structure, and a second portion of the flexible tube.

In certain embodiment(s), a cross-section of the heat dissipation device includes, in this order, a first portion of the flexible tube, a first portion of the support ring, a first portion of the second capillary structure, a second portion of the second capillary structure, a second portion of the support ring, and a second portion of the flexible tube.

In certain embodiment(s), a cross-section of the heat dissipation device includes, in this order, a first portion of the flexible tube, a first portion of the rigid tube, a first portion of the first capillary structure, a second portion of the first capillary structure, a second portion of the rigid tube, and a second portion of the flexible tube.

In another aspect, the present disclosure provides an electronic equipment. The electronic equipment includes a heat dissipation device, and heat dissipation device includes: a rigid tube, including a first cavity; a first capillary structure, at least a portion of the first capillary structure being positioned within the first cavity; a flexible tube, including a second cavity, the flexible tube being more flexible than the rigid tube; and a second capillary structure, at least a portion of the second capillary structure being positioned within the second cavity, where the heat dissipation device is deformable via the flexible tube.

In yet another aspect, the present disclosure provides a method of dissipating heat off of a heat-generating part, the method includes: connecting a heat dissipation device to the heat-generating part, wherein the heat dissipation device includes: a rigid tube, including a first cavity; a first capillary structure, at least a portion of the first capillary structure being positioned within the first cavity; a flexible tube, including a second cavity, the flexible tube being more flexible than the rigid tube; and a second capillary structure, at least a portion of the second capillary structure being positioned within the second cavity, where the heat dissipation device is deformable via the flexible tube.

Figure 1:
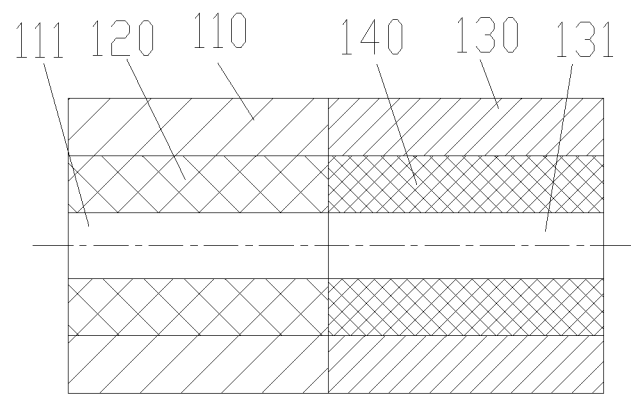
FIG. 1 is a schematic structural diagram of a heat dissipation device according to certain embodiment(s) of the present disclosure.
Figure 2:
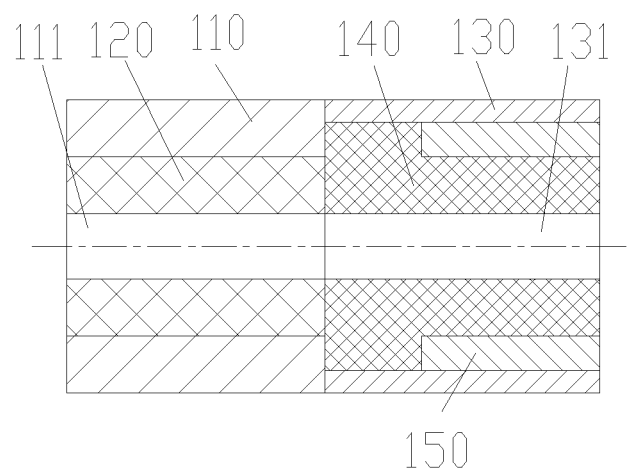
FIG. 2 is a schematic structural diagram of a heat dissipation device according to certain embodiment(s) of the present disclosure.

Reference numerals: 110, rigid tube; 111, first cavity; 120, first capillary structure; 130, flexible tube; 131, second cavity; 140, second capillary structure; 150, support ring; 160, heat sink.

DETAILED DESCRIPTION

The technical solutions of the present disclosure are elaborated below with reference to the accompanying drawings and embodiment(s) of the detailed description.

According to certain embodiment(s) of the present disclosure, and unless otherwise stated and limited, the term "connection" or "connect" or "connecting", when used, should be understood in a broad sense, for example, it may refer to an electrical connection, or an internal communication between two components, or a direct connection, and may also refer to an indirection connection through an intermediate medium. For those of ordinary skill in the art, the specific meanings of the above terms can be understood according to specific situations.

It should be noted that the term "first\second\third" involved in the embodiment(s) of the present disclosure is only to distinguish similar objects, and does not represent a specific order of the objects. It is understood that "first\second\third" may interchange in order or sequence where permitted. It should be understood that the objects distinguished by the term "first\second\third" may be interchanged under appropriate circumstances such that the embodiment(s) of the present disclosure may be practiced in sequences other than those illustrated or described herein.

The heat dissipation device according to the embodiment(s) of the present disclosure is described in detail below with reference to FIGS. 1 to 8.

According to certain embodiment(s) of the present disclosure, the heat dissipation device includes: a rigid tube 110, a first capillary structure 120, a flexible tube 130, and a second capillary structure 140. The rigid tube 110 includes a first cavity 111; the first capillary structure 120 is positioned inside of the first cavity 111; the flexible tube 130 is connected to the rigid tube 110, and the flexible tube 130 includes a second cavity 131; the second cavity 131 communicates with the first cavity 111; the second capillary structure 140 is positioned inside of the second cavity 131; the second capillary structure 140 is connected to the first capillary structure 120, and the second capillary structure 140 is deformable; and the heat dissipation device can be deformed based on the flexible tube 130. The deformation of the flexible tube 130 and the second capillary structure 140 enables the heat dissipation device to have deformability, and the deformation of the flexible tube 130 and the second capillary structure 140 enables the heat dissipation device to have different shapes, which greatly improves the adaptability of the heat dissipation device.

According to certain embodiment(s) of the present disclosure, the heat dissipation device is used to dissipate heat off of the heat-generating part, and the heat dissipation medium may be disposed in the first capillary structure 120 and the second capillary structure 140; the heat dissipation medium may flow inside of the first capillary structure 120 and the second capillary structure 140, and when the heat dissipation medium absorbs the heat of the heat-generating part, the heat dissipation medium can take away the absorbed heat. In certain embodiment(s), when the heat dissipation medium absorbs the heat of the heat-generating part, the heat dissipation medium can be converted from a liquid state to a gaseous state; In certain particular embodiment(s), the heat dissipation medium can be water.

According to certain embodiment(s) of the present disclosure, the structure of the rigid tube 110 is not limited. For example, the rigid tube 110 may be an aluminum tube or a copper tube.

According to certain embodiment(s) of the present disclosure, the shape of the first cavity 111 is not limited. For example, the first 111 may be a cylindrical structure. For another example, the first cavity 111 may be a square columnar structure.

According to certain embodiment(s) of the present disclosure, the structure of the first capillary structure 120 is not limited. For example, the first capillary structure 120 may be formed by sintering copper powder. For another example, the first capillary structure 120 may be formed by sintering copper wires.

According to certain embodiment(s) of the present disclosure, the structure of the flexible tube 130 is not limited, as long as the flexible tube 130 can be deformed.

According to certain embodiment(s) of the present disclosure, the material of the flexible tube 130 is not limited. For example, the material of the flexible tube 130 may be metal. As an example, the material of the flexible tube 130 may be copper or aluminum.

According to certain embodiment(s) of the present disclosure, the flexible tube 130 may be deformable based on the structure.

According to certain embodiment(s) of the present disclosure, the material of the flexible tube 130 may be metal, and the wall thickness of the flexible tube 130 may be smaller than a first set value. The first set value is used to satisfy that the flexible tube 130 can be deformed to form a flexible structure.

According to certain embodiment(s) of the present disclosure, the material of the flexible tube 130 may be metal, the wall of the flexible tube 130 may be a folded structure, and the flexible tube 130 can be deformed by the wall of the folded structure; in certain particular embodiment(s), the flexible tube 130 may also have elasticity. As an example, the flexible tube 130 may be a metal corrugated tube.

According to certain embodiment(s) of the present disclosure, the flexible tube 130 may be deformable based on memory; in certain particular embodiment(s), the material of the flexible tube 130 may be a memory alloy.

According to certain embodiment(s) of the present disclosure, the shape of the second cavity 131 is not limited. For example, the second cavity 131 may be a cylindrical structure. For another example, the second cavity 131 may be a square columnar structure.

According to certain embodiment(s) of the present disclosure, the flexible tube 130 and the rigid tube 110 may be connected by clad rolling.

Figure 5:
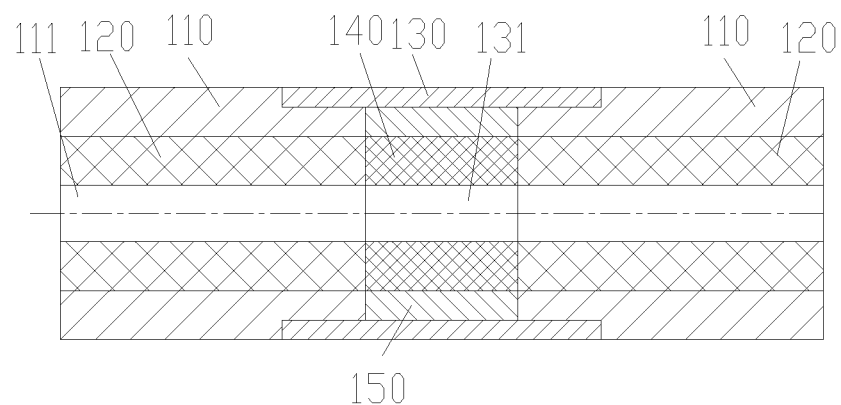
FIG. 5 is a schematic structural diagram of a heat dissipation device according to certain embodiment(s) of the present disclosure.
Figure 6:
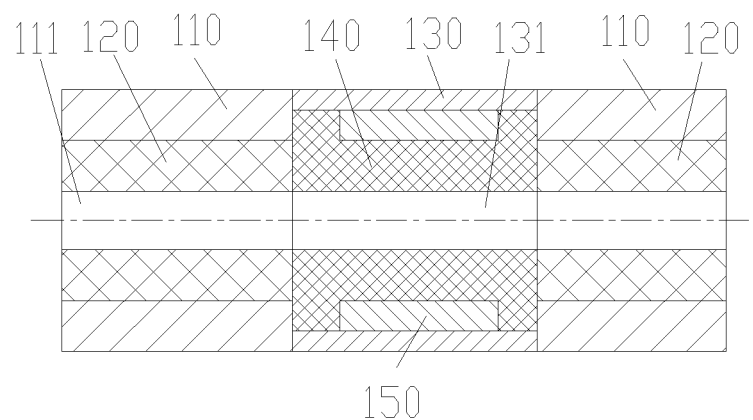
FIG. 6 is a schematic structural diagram of a heat dissipation device according to certain embodiment(s) of the present disclosure.

According to certain embodiment(s) of the present disclosure, the number of rigid tubes 110 is not limited. For example, and as shown in FIG. 5 and FIG. 6, the heat dissipation device may include: two rigid tubes 110, which are respectively connected to two ends of the flexible tube 130, and the two rigid tubes 110 can, via the flexible tube 130, adjust the positional relationship between the two rigid tubes 110, so that the heat dissipation device has the ability to deform by arranging the flexible tube 130 between the rigid tubes 110. Accordingly, the two rigid tubes 110 can be used to dissipate heat off of two different heat-generating parts. At this time, since the positional relationship between the two rigid tubes 110 can be adjusted based on the flexible tubes 130, the positions of the two heat-generating parts can be set at wish, which greatly improves the adaptability of the heat dissipation device.

According to certain embodiment(s) of the present disclosure, the structure of the second capillary structure 140 is not limited, as long as the second capillary structure 140 can be deformed.

For example, the second capillary structure 140 may include: a first pipe-shaped part, the first pipe-shaped part is disposed in the second cavity 131, the first pipe-shaped part has elasticity, and the first pipe-shaped part can be deformed.

According to certain embodiment(s) of the present disclosure, the first pipe-shaped part may be a rigid material, and the first pipe-shaped part may be curved or helical, and the curved or helical first pipe-shaped part has elasticity, such that the elastically curved or helical first pipe-shaped part can be deformed. As an example, the first pipe-shaped part may form a spring-like structure.

According to certain embodiment(s) of the present disclosure, the number of the first pipe-shaped part is not limited. For example, the second capillary structure 140 may include: at least two first pipe-shaped parts, and the at least two first pipe-shaped parts may form a mesh structure. In certain embodiment(s), the at least two first pipe-shaped parts may not form a mesh structure. As an example, the at least two first pipe-shaped parts may be substantially parallel.

According to certain embodiment(s) of the present disclosure, and to enable the second capillary structure 140 to have deformability, the second capillary structure 140 may be denser than the first capillary structure 120; accordingly, the denser second capillary structure 140 is used to improve the cooling capacity of the heat dissipation device. As an example, the second capillary structure 140 has at least two first pipe-shaped parts; the at least two first pipe-shaped parts form a first mesh structure; the first mesh structure has a first hole-shaped cavity; when the flexible tube 130 is deformed, a cross-sectional area of the first hole-shaped cavity changes; the first capillary structure 120 has at least two second pipe-shaped parts; the at least two second pipe-shaped parts form a second mesh structure; the second mesh structure has a second hole-shaped cavity; where, the cross-sectional area of the first hole-shaped cavity is smaller than the cross-sectional area of the second hole-shaped cavity.

According to certain embodiment(s) of the present disclosure, the heat dissipation device includes two rigid tubes 110, a second capillary structure 140 is provided in the second cavity 131 of each rigid tube 110, and the second capillary structure 140 in each second cavity 131 is connected to the first capillary structure 120.

According to certain embodiment(s) of the present disclosure, the second capillary structure 140 may be directly disposed in the second cavity 131, as shown in FIG. 1. The second capillary structure 140 may also be disposed in other structures in the second cavity 131.

According to certain embodiment(s) of the present disclosure, the heat dissipation device may further include: a support ring 150, the support ring 150 is positioned inside of the second cavity 131, and the support ring 150 is used to support the flexible tube 130, at least part of the second capillary structure 140 may be disposed in a cavity of the support ring 150. The support ring 150 supports the flexible tube 130, which can prevent the flexible tube 130 from being deformed. The second capillary structures 140 located at opposing sides of the flexible tube 130 are attached together to cause a liquid heat dissipation medium to settle, which affects the thermal conductivity of the heat dissipation device.

According to certain embodiment(s) of the present disclosure, the material of the support ring 150 is not limited. For example, the support ring 150 may have a certain rigidity, and when the flexible tube 130 is deformed, the shape of the support ring 150 may deform less or remain unchanged. As an example, the support ring 150 may be a copper ring or an aluminum ring.

According to certain embodiment(s) of the present disclosure, the support ring 150 and the flexible tube 130 may be connected by sintering.

According to certain embodiment(s) of the present disclosure, the positional relationship among the support ring 150, the flexible tube 130, and the second capillary structure 140 is not limited.

For example, the support ring 150 is in contact with a portion of the rigid tube 110, the flexible tube 130 is positioned outside the support ring 150 and the portion of the rigid tube 110, and the flexible tube 130 has elasticity.

Figure 3:
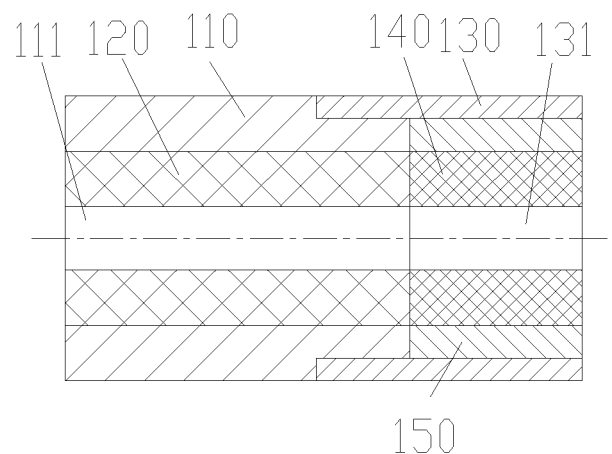
FIG. 3 is a schematic structural diagram of a heat dissipation device according to certain embodiment(s) of the present disclosure.

In certain embodiment(s) of the present disclosure, a first plane of the support ring 150 may be in contact with a second plane of the portion of the rigid tube 110, as shown in FIG. 3.

According to certain embodiment(s) of the present disclosure, under an external force, the support ring 150 and the portion of the rigid tube 110 forms an angle, the support ring 150 and the portion of the rigid tube 110 can abut at an abutting point when in a contact position, and the abutting point may serve as a pivot for the support ring 150 to rotate relative to the portion of the rigid tube 110. The angle formed at the contact position between the support ring 150 and the portion of the rigid tube 110 can increase or decrease. When the angle formed at the contact position by the support ring 150 and the portion of the rigid tube 110 increases, the adaptive deformation of the flexible tube 130 and the second capillary structure 140 increases; when the angle formed at the contact position by the support ring 150 and the portion of the rigid tube 110 decreases, the adaptive deformation of the flexible tube 130 and the second capillary structure 140 decreases as well.

According to certain embodiment(s), and under an external force, the flexible tube 130 experiences a greater deformation at a location corresponding to where the support ring 150 and the rigid tube 110 together form a relatively greater gap. The flexible tube 130 with elasticity can prevent the flexible tube 130 from being deformed too greatly and hence damaged.

Figure 4:
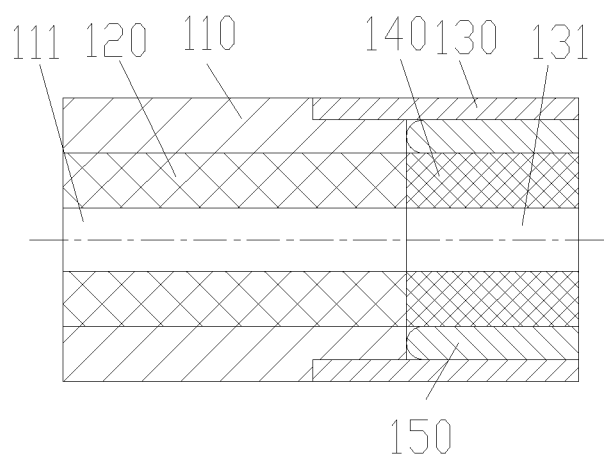
FIG. 4 is a schematic structural diagram of a heat dissipation device according to certain embodiment(s) of the present disclosure.

According to certain embodiment(s) of the present disclosure, a first flat surface of the support ring 150 may also be in contact with a first convex surface of the portion of the rigid tube 110 as shown in FIG. 4. According to certain embodiment(s) of the present disclosure, the first convex surface may be an arc surface, so as to facilitate relative rotation between the support 150 and the portion of the rigid tube 110 and hence to smooth the deformation of the heat dissipation device.

According to certain embodiment(s) of the present disclosure, the second capillary structures 140 is entirely positioned within the support ring 150, as shown in FIG. 3. In certain other embodiment(s), the second capillary structure 140 is partially positioned within the support ring 150 and partially positioned within the portion of the rigid tube 110.

According to certain embodiment(s) of the present disclosure, a first gap is formed between the support ring 150 and the rigid tube 110, and a portion of the second capillary structure 140 is positioned within the first gap.

According to certain embodiment(s) of the present disclosure, the second capillary structure 140 in the first gap is directly formed within the flexible tube 130, where, the heat dissipation device may deform through the flexible tube 130 and the second capillary structure 140 inside of the flexible tube 130.

According to certain embodiment(s) of the present disclosure, the portion of the first cavity 111 relatively closer to a side of the flexible tube 130 may be provided with a second capillary structure 140. If only first capillary structure 120 is provided in the first cavity 111, and when the flexible tube 130 is deformed, an adaptive deformation of the second capillary structure 140 may pull the first capillary structure 120 and hence damage the first capillary structure. By positioning the second capillary structure 140 in the portion of the first cavity 111 relatively closer to the side of the flexible tube 130, damage to the first capillary structure 120 due to the adaptive deformation and pulling of the second capillary structure 140, when the flexible tube 130 is deformed, may be avoided.

According to certain embodiment(s) of the present disclosure, the first capillary structure 120 is deformable, and the second capillary structure 140 is not positioned within the first cavity 111, and the first capillary structure 120 deforms to adapt to a pulling force due to the deformation of the second capillary structure 140.

According to certain embodiment(s) of the present disclosure, an inner surface of the support ring 150 is flush or substantially flush with an inner surface of the rigid tube 110. According to certain embodiment(s) of the present disclosure, an inner surface of the support ring 150 is not flush or not substantially flush with an inner surface of the rigid tube 110.

According to embodiment(s) of the present disclosure, a number of the support rings 150 is not limited.

For example, the heat dissipation device may further include: at least two support rings 150; the at least two support rings 150 are arranged in the second cavity 131 at intervals, and the at least two support rings 150 are used to support the flexible tube 130; so as to support the flexible tube 130 through the at least two support rings 150. The at least two support rings 150 are spaced apart, the heat dissipation device can be deformed through the space between adjacent support rings 150 of the at least two support rings 150.

According to certain embodiment(s) of the present disclosure, at least two support rings 150 may be in contact with the rigid tube 110, or a gap may be formed between the at least two support rings 150.

Figure 7:
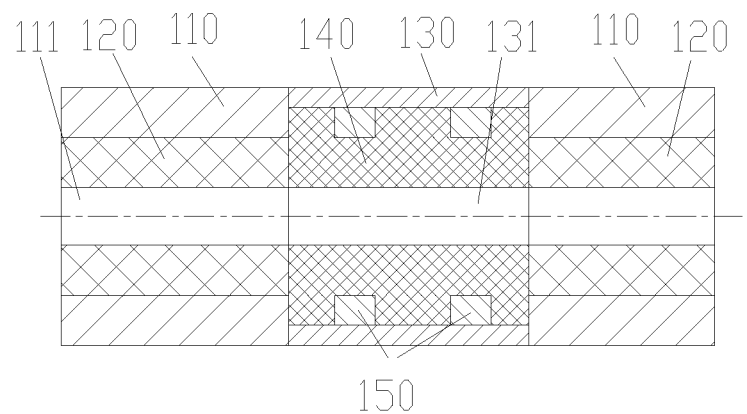
FIG. 7 is a schematic structural diagram of a heat dissipation device according to certain embodiment(s) of the present disclosure.

According to certain embodiment(s) of the present disclosure, the second capillary structure 140 may be disposed in the gap between the two adjacent support rings 150, as shown in FIG. 7.

Figure 8:
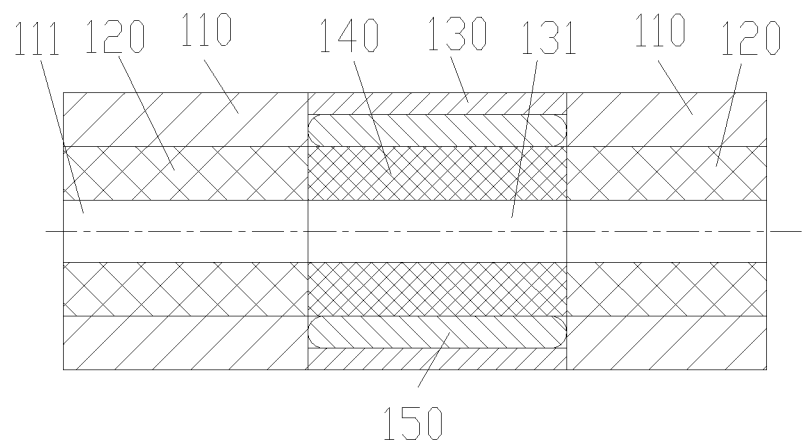
FIG. 8 is a schematic structural diagram of a heat dissipation device according to certain embodiment(s) of the present disclosure.

According to certain embodiment(s) of the present disclosure, the heat dissipation device includes two rigid tubes 110, the two rigid tubes 110 can be in contact with the support ring 150, as shown in FIG. 8 and FIG. 5. In certain embodiment(s) of the present disclosure, a gap is formed between the two rigid tubes 110 and the support ring 150, as shown in FIGS. 6 and 7.

According to certain embodiment(s) of the present disclosure, an outer surface of the flexible tube 130 is flush with an outer surface of the rigid tube 110. According to certain embodiment(s) of the present disclosure, an inner surface of the support ring 150 is flush with an inner surface of the rigid tube 110. According to certain embodiment(s) of the present disclosure, an outer surface of the flexible tube 130 is not flush with an outer surface of the rigid tube 110. According to certain embodiment(s) of the present disclosure, an inner surface of the support ring 150 is not flush with an inner surface of the rigid tube 110.

The heat dissipation device according to certain embodiment(s) of the present disclosure includes: a rigid tube 110 having a first cavity 111; a first capillary structure 120, disposed in the first cavity 111; a flexible tube 130, connected to the rigid tube 110 and having a second cavity 131; the second cavity 131 being in communication with the first cavity 111; the second capillary structure 140 is disposed in the second cavity 131, is connected to the first capillary structure 120, and is deformable; the heat dissipation device can be deformed based on the flexible tube 130. The deformation of the flexible tube 130 and the second capillary structure 140 enables the heat dissipation device to have deformability, and the deformation of the flexible tube 130 and the second capillary structure 140 enables the heat dissipation device to have different shapes, greatly improving the adaptability of the heat dissipation device.

Certain embodiment(s) of the present disclosure further describes an electronic equipment, and the electronic device includes the heat dissipation device described herein.

According to certain embodiments of the present application, the structure of the electronic equipment is not limited. For example, the electronic equipment may be a computer or a mobile phone.

According to certain embodiment(s) of the present disclosure, the electronic equipment may further include: a first heat-generating part 210 and a second heat-generating part 210; the heat dissipation device may include: two rigid tubes 110, the two rigid tubes 110 are respectively connected to two ends of the flexible tube 130. The two rigid tubes 110 can, via the flexible tube 130, adjust the positional relationship between the two rigid tubes 110; one of the two rigid tubes 110 is used to dissipate heat off of the first heat-generating part 210, and the other rigid tube 110 of the two rigid tubes 110 is used to dissipate heat off of the second heat-generating part 210, such that by positioning the flexible tube 130 between the rigid tubes 110, the heat dissipation device has the ability to deform; at the same time, the two rigid tubes 110 can also dissipate heat concurrently off of the first heat-generating part 210 and the second heat-generating part 210. The two rigid tubes 110 can adjust the positional relationship between the two rigid tubes 110 based on the flexible tube 130, and the positions of the first heat-generating part 210 and the second heat-generating part 210 can be set at wish, which greatly improves the adaptability of the heat sink.

Figure 9:
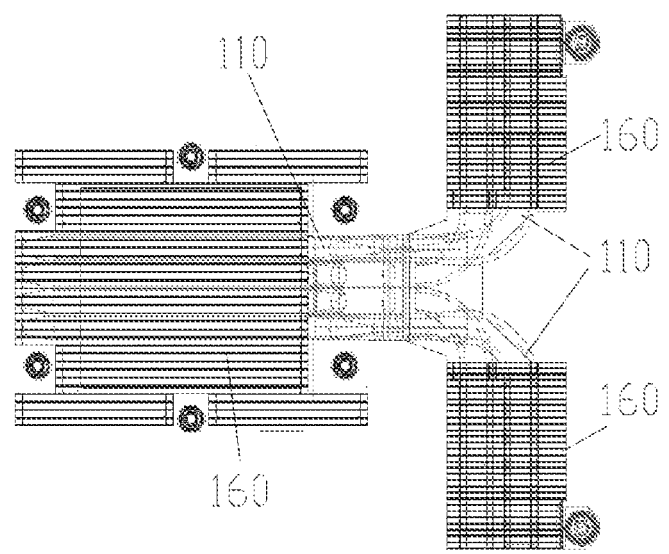
FIG. 9 is a schematic diagram of a partial structure of an electronic equipment according to certain embodiment(s) of the present disclosure.
Figure 10:
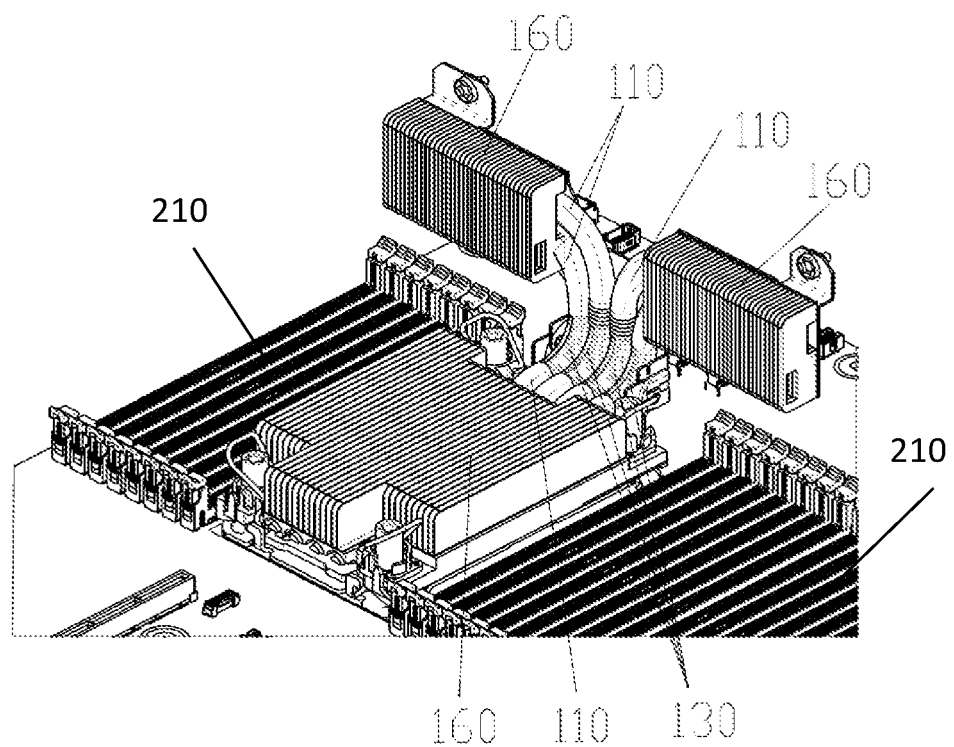
FIG. 10 is a schematic diagram of a partial structure of an electronic equipment according to certain embodiment(s) of the present disclosure.

In addition, since the positional relationship between the two rigid tubes 110 can be adjusted based on the flexible tubes 130, the two rigid tubes 110 are easy to assemble and disassemble, which greatly improves the adaptability of the heat dissipation device. As an example, one rigid tube 110 of the two rigid tubes 110 is used to dissipate heat for the first heat-generating part 210, and the other rigid tube 110 of the two rigid tubes 110 is used for dissipating heat for the second heat-generating part 210. The heat-generating parts can be located at a same level of the electronic equipment; if other structural elements at the second heat-generating part 210 need to be repaired or adjusted, due to the blocking effect of the other rigid tube 110 of the two rigid tube 110, the other rigid tube 110 of the rigid tubes 110 is to be removed; if there is no flexible tube 130 between the two rigid tubes 110, the two rigid tubes 110 need to be removed at the same time, as shown in FIG. 9. When a flexible tube 130 is arranged between the two rigid tubes 110, and only the other rigid tube 110 of the two rigid tubes 110 needs to be removed, and the position of the other rigid tube 110 of the two rigid tube 110 can be adjusted based on the flexible tube 130, so as to facilitate the repair and the adjustment. As shown in FIG. 10, one rigid tube 110 of the two rigid tubes 110 does not need to be removed and does not need to be re-applied with thermal silicone grease, which greatly reduces the difficulty in disassembling or repairing the electronic equipment, and improves the disassembly and assembly efficiency of the heat dissipation device.

According to certain embodiment(s) of the present disclosure, and as shown in FIGS. 9 and 10, the rigid tube 110 and the heat-generating part may be in contact with the heat sink 160.

The above descriptions are certain embodiment(s) of the present disclosure, the protection scope of the present disclosure is not limited to the above descriptions. Any person skilled in the art who is familiar with the technical scope disclosed in the present disclosure can easily think of changes or substitutions, which should be covered by the protection scope of the present disclosure. The protection scope of the present disclosure is subject to the protection scope of the claims.

What is claimed is:

1. A heat dissipation device, comprising:
   a rigid tube, including a first cavity;
   a first capillary structure, at least a portion of the first capillary structure being positioned within the first cavity;
   a flexible tube, including a second cavity, the flexible tube being more flexible than the rigid tube; and
   a second capillary structure being denser than the first capillary structure, at least a portion of the second capillary structure being positioned within the second cavity, and each end of the second capillary structure being connected with the first capillary structure,
   wherein the heat dissipation device is deformable via the flexible tube.

2. The heat dissipation device of claim 1, wherein the first capillary structure includes a metal.

3. The heat dissipation device of claim 1, further comprising:
   a support ring, at least a portion of the support ring being positioned within the second cavity.

4. The heat dissipation device of claim 3, wherein at least a second portion of the second capillary structure is positioned within a cavity of the support ring.

5. The heat dissipation device of claim 3, wherein the support ring contacts the rigid tube.

6. The heat dissipation device of claim 3, wherein a gap is present between the support ring and the rigid tube, and a second portion of the second capillary structure is positioned within the gap.

7. The heat dissipation device of claim 3, wherein the support ring is a first support ring, and the heat dissipation device further comprises:
   a second support ring, positioned in the second cavity and being spaced apart from the first support ring.

8. The heat dissipation device of claim 1, wherein the second capillary structure comprises:
   a pipe-shaped part, the pipe-shaped part being curved or spiral.

9. The heat dissipation device according to claim 1, wherein the rigid tube is a first rigid tube, and the heat dissipation device further comprises:
   a second rigid tube, the first and the second rigid tubes respectively connected to two ends of the flexible tube, a positional relationship between the first and the second rigid tubes is changeable via the flexible tube, wherein the flexible tube is deformable.

10. The heat dissipation device according to claim 1, wherein a cross-section of the heat dissipation device includes, in this order, a first portion of the flexible tube, a first portion of the second capillary structure, a second portion of the second capillary structure, and a second portion of the flexible tube.

11. The heat dissipation device according to claim 3, wherein a cross-section of the heat dissipation device includes, in this order, a first portion of the flexible tube, a first portion of the support ring, a first portion of the second capillary structure, a second portion of the second capillary structure, a second portion of the support ring, and a second portion of the flexible tube.

12. The heat dissipation device according to claim 1, wherein a cross-section of the heat dissipation device includes, in this order, a first portion of the flexible tube, a first portion of the rigid tube, a first portion of the first capillary structure, a second portion of the first capillary structure, a second portion of the rigid tube, and a second portion of the flexible tube.

13. An electronic equipment, comprising a heat dissipation device, the heat dissipation device comprises:
   a rigid tube, including a first cavity;
   a first capillary structure, at least a portion of the first capillary structure being positioned within the first cavity;
   a flexible tube, including a second cavity, the flexible tube being more flexible than the rigid tube; and
   a second capillary structure being denser than the first capillary structure, at least a portion of the second capillary structure being positioned within the second cavity, and each end of the second capillary structure being connected with the first capillary structure,
   wherein the heat dissipation device is deformable via the flexible tube.

14. The electronic equipment of claim 13, wherein the heat dissipation device further comprises:
   a support ring, at least a portion of the support ring being positioned within the second cavity.

15. The electronic equipment of claim 14, wherein at least a second portion of the second capillary structure is positioned within a cavity of the support ring.

16. The electronic equipment of claim 13, wherein a cross-section of the heat dissipation device includes, in this order, a first portion of the flexible tube, a first portion of the second capillary structure, a second portion of the second capillary structure, and a second portion of the flexible tube.

17. The electronic equipment of claim 13, wherein a cross-section of the heat dissipation device includes, in this order, a first portion of the flexible tube, a first portion of the support ring, a first portion of the second capillary structure, a second portion of the second capillary structure, a second portion of the support ring, and a second portion of the flexible tube.

18. The electronic equipment of claim 13, wherein a cross-section of the heat dissipation device includes, in this order, a first portion of the flexible tube, a first portion of the rigid tube, a first portion of the first capillary structure, a second portion of the first capillary structure, a second portion of the rigid tube, and a second portion of the flexible tube.

19. The electronic equipment of claim 13, wherein the rigid tube is a first rigid tube, and electronic equipment further comprises:
- a second rigid tube, the flexible tube being positioned between the first rigid tube and the second rigid tube; and
- a first heat-generating part and a second heat-generating part, wherein the first rigid tube is to dissipate heat off of the first heat-generating part and the second rigid tube is to dissipate heat off of the second heat-generating part.

20. A method of dissipating heat off of a heat-generating part, the method comprising:
- connecting a heat dissipation device to the heat-generating part, wherein the heat dissipation device includes:
- a rigid tube, including a first cavity;
- a first capillary structure, at least a portion of the first capillary structure being positioned within the first cavity;
- a flexible tube, including a second cavity, the flexible tube being more flexible than the rigid tube; and
- a second capillary structure being denser than the first capillary structure, at least a portion of the second capillary structure being positioned within the second cavity, and each end of the second capillary structure being connected with the first capillary structure,
- wherein the heat dissipation device is deformable via the flexible tube.

* * * * *